(12) United States Patent
Tsuzuki et al.

(10) Patent No.: US 8,168,999 B2
(45) Date of Patent: May 1, 2012

(54) SEMICONDUCTOR DEVICE HAVING IGBT AND DIODE

(75) Inventors: Yukio Tsuzuki, Nukata-gun (JP); Kenji Kouno, Gifu (JP)

(73) Assignee: DENSO CORPORATION, Kariya (JP)

( * ) Notice: Subject to any disclaimer, the term of this patent is extended or adjusted under 35 U.S.C. 154(b) by 122 days.

(21) Appl. No.: 12/385,164

(22) Filed: Mar. 31, 2009

(65) Prior Publication Data
US 2009/0242931 A1    Oct. 1, 2009

(30) Foreign Application Priority Data

Apr. 1, 2008   (JP) .................................. 2008-95451
Mar. 27, 2009  (JP) .................................. 2009-80183

(51) Int. Cl.
*H01L 27/06*   (2006.01)
*H01L 29/739*  (2006.01)

(52) U.S. Cl. . 257/143; 257/330; 257/375; 257/E27.019; 257/E29.255; 257/E29.626; 438/197; 438/237; 438/259; 438/270

(58) Field of Classification Search .................. 257/143, 257/E29.197, E27.019, 329–335, 341, 370, 257/375, 476, E29.254–E29.257, E29.626; 438/197, 237, 257, 259, 268, 270
See application file for complete search history.

(56) References Cited

U.S. PATENT DOCUMENTS

| | | | |
|---|---|---|---|
| 5,360,984 A | 11/1994 | Kirihata | |
| 6,946,711 B2 * | 9/2005 | Suzuki et al. | 257/376 |
| 7,190,027 B2 * | 3/2007 | Takahashi et al. | 257/339 |
| 2005/0045960 A1 | 3/2005 | Takahashi | |
| 2005/0258493 A1 * | 11/2005 | Aono et al. | 257/370 |
| 2007/0069287 A1 | 3/2007 | Takahashi | |
| 2007/0170549 A1 * | 7/2007 | Tsuzuki et al. | 257/565 |
| 2007/0200138 A1 | 8/2007 | Ozeki et al. | |
| 2008/0048295 A1 | 2/2008 | Takahashi | |
| 2008/0093697 A1 | 4/2008 | Kaneda et al. | |

FOREIGN PATENT DOCUMENTS

JP    A-6-196705    7/1994

* cited by examiner

*Primary Examiner* — Khiem D Nguyen
*Assistant Examiner* — Walter H Swanson
(74) *Attorney, Agent, or Firm* — Posz Law Group, PLC

(57) ABSTRACT

A semiconductor device includes: a substrate; an active element cell area including IGBT cell region and a diode cell region; a first semiconductor region on a first side of the substrate in the active element cell area; a second semiconductor region on a second side of the substrate in the IGBT cell region; a third semiconductor region on the second side in the diode cell region; a fourth semiconductor region on the first side surrounding the active element cell area; a fifth semiconductor region on the first side surrounding the fourth semiconductor region; and a sixth semiconductor region on the second side below the fourth semiconductor region. The second semiconductor region, the third semiconductor region and the sixth semiconductor region are electrically coupled with each other.

14 Claims, 15 Drawing Sheets

SEMICONDUCTOR DEVICE HAVING IGBT AND DIODE

CROSS REFERENCE TO RELATED APPLICATION

This application is based on Japanese Patent Application No. 2008-95451 filed on Apr. 1, 2008, the disclosure of which is incorporated herein by reference.

FIELD OF THE INVENTION

The present invention relates to a semiconductor device having an IGBT and a diode.

BACKGROUND OF THE INVENTION

An inverter circuit for driving a load such as a motor is a converter between direct current and alternating current. The circuit converts a direct current voltage to an alternating current voltage, and then, energizes the load such as a motor. The inverter circuit for driving an inductive motor includes an IGBT (i.e., insulated gate bipolar transistor) as a switching element and a FWD (i.e., free wheel diode). The IGBT functions as a switching element, and the FWD bypasses the current flowing through the motor when the IGBT turns off so that the current flowing through the motor is not changed by a switching operation of the IGBT. Specifically, a direct current power supply and the motor are connected to each other. When the IGBT for applying the voltage to the motor turns off, the current flowing through the motor flows back via the FWD because of the energy accumulated in an inductance L of the motor. Thus, the motor becomes a state equivalent to a case where the reverse direct current voltage is applied to the motor. Accordingly, since the current of the motor is not shut down rapidly because of the switching operation of the IGBT, the alternating current voltage caused by the switching operation is substantially supplied from the direct current power source. Since the inverter circuit performs the above function, it is necessary to form a diode, which is inversely connected to the IGBT in series. Specifically, it is necessary to form the diode that is inversely connected in parallel to the IGBT, which pairs up with another IGBT.

FIG. 10 is an equivalent circuit diagram of a semiconductor device 90 suitably used for an inverter circuit, which drives a load such as a motor. The device 90 includes an IGBT 90$i$ and a diode 90$d$, which are inversely connected in parallel to each other.

When the diode 90$d$ in the device 90 is used as a FWD in the inverter circuit, it is important to form a current waveform appropriately in a case where the diode is recovered inversely when the diode switches from an on-state to an off-state.

FIG. 11A shows a circuit for measuring and evaluating the current waveform flowing through the diode 90$d$. FIG. 11B shows an example of the current waveform.

The circuit for measuring includes two semiconductor devices 90$a$, 90$b$, each of which is equivalent to the device 90 in FIG. 10. The IGBT 90$ai$ in the device 90$a$ functions as a switching element. The IGBT 90$bi$ in the device 90$b$ short-circuits so that a waveform of a current Id flowing through the diode 90$bd$ is measured.

As shown in FIG. 11B, when the IGBT 90$ai$ of the device 90$a$ turns off, a circulation current Iif flows through the diode 90$bd$ in the device 90$b$. When the IGBT 90$ai$ in the device 90$a$ turns on, a current inversely and instantaneously flows through the diode 90$bd$ in the device 90$b$. A peak of the current inversely flowing is defined as a recovery current Irr. When the circuit is recovered inversely, the power source voltage is applied to the diodes. A product of the voltage and the recovery current Irr is defined as a recovery loss. In general, it is required for a rectifier diode to have a small recovery current Irr and a small recovery loss in case of inverse recovery time so that the current in the diode is recovered gradually in case of inverse recovery time. This recovery of the diode is defined as soft recovery.

In the device 90 in FIG. 10, the IGBT 90$i$ and the diode 90$d$ are formed on different semiconductor substrates or semiconductor chips, respectively. The IGBT 90$i$ and the diode 90$d$ are inversely connected in parallel to each other via an electric wiring. To reduce the dimensions of the device 90, it is preferred that the IGBT 90$i$ and the diode 90$d$ are formed on the same semiconductor substrate.

FIGS. 12A and 12B show the semiconductor device 80 in JP-A-2007-227806. FIG. 13 is a cross sectional view of the device 80.

The device 80 is used for an inverter in a vehicle. The device 80 includes an IGBT cell region and a diode cell region, which are formed on the same semiconductor substrate 1 having a N$^-$conductive type. In the device 80, the IGBT cell region and the diode cell region provide an active device cell area. In the cell area, a first semiconductor region 2 having a P conductive type is formed in a surface portion of the substrate 1 on a principal side. The first semiconductor region 2 provides a channel forming region in the IGBT cell region and an anode region in the diode cell region. An emitter region 3 of the IGBT is formed in the first semiconductor region 2. A gate electrode G in a trench is formed in the IGBT cell region. A structure similar to the gate electrode G is formed in the diode cell region, and is not electrically connected to another part. The structure merely divides the diode cell region into multiple parts. In the IGBT cell region, a second semiconductor region 4 having a P$^+$conductive type is formed in a surface portion of the substrate 1 on a backside. The second semiconductor region 4 provides a collector region. In the diode cell region, a third semiconductor region 5 is formed in a surface portion of the substrate 1 on the backside. The third semiconductor region 5 having a N$^{30}$ conductive type provides a cathode region. In FIG. 13, a current flowing through the diode cell region is shown as an arrow when the diode functions under a forward voltage. A field stop layer 1$a$ of the IGBT is formed on both of the second and third semiconductor regions 4, 5. The field stop layer 1$a$ has a N conductive type.

In a pad region, a fourth semiconductor region 6 having the P conductive type is formed in a surface portion of the substrate 1 on a principal side. The fourth semiconductor region 6 surrounds the cell area. The first and fourth semiconductor regions 2, 6 are electrically connected to each other together with the emitter region 3 in the IGBT cell region via an emitter electrode wiring E. A pad 8 is formed on the fourth semiconductor region 6 via a LOCOS oxide film 7. The pad 8 provides the pad region for bonding with a wiring. In the periphery area, a fifth semiconductor region 9 having the P conductive type and providing the withstand region is formed in a surface portion of the substrate 1 on the principal side. The fifth semiconductor region 9 surrounds the fourth semiconductor region 6. The pad region and the withstand region provide the periphery area. In the periphery area, the second semiconductor region 4 is formed on the backside of the substrate 1 so that the second semiconductor region 4 extends from the IGBT cell region. The second semiconductor region 4 and the third semiconductor region 5 in the diode cell region are electrically connected to each other via a collector electrode C, which is formed on a whole surface of the backside of the substrate 1.

FIG. 14 shows an example of a voltage-current (i.e., Vf-If) characteristic of a diode, which is used in an inverter circuit in a vehicle when the diode functions along with the forward direction. FIG. 15 shows a relationship between a recovery current Irr and a forward operation voltage Vf when the diode is used for a FWD.

As shown in FIG. 15, the recovery current Irr and the forward operation voltage Vf have a trade-off relationship. Specifically, when the recovery current Irr becomes small, the forward operation voltage Vf increases, as shown in an arrow XVA. On the other hand, when the forward operation voltage Vf becomes small, the recovery current Irr increases, as shown in an arrow XVB.

Thus, it is required for the semiconductor device having the IGBT cell region and the diode cell region that are formed on the same substrate to have a small forward operation voltage Vf and a small recovery current Irr.

SUMMARY OF THE INVENTION

In view of the above-described problem, it is an object of the present disclosure to provide a semiconductor device having an IGBT and a diode.

According to an aspect of the present disclosure, a semiconductor device includes: a semiconductor substrate having a N conductive type and having a first side and a second side opposite to the first side; an active element cell area including IGBT cell region and a diode cell region and arranged in the substrate; a first semiconductor region having a P conductive type and arranged in a first surface portion on the first side of the substrate in the active element cell area, wherein the first semiconductor region provides both of a channel forming region of the IGBT cell region and an anode region of the diode cell region; a second semiconductor region having the P conductive type and arranged in a second surface portion on the second side of the substrate in the IGBT cell region, wherein the second semiconductor region provides a collector region of the IGBT cell region; a third semiconductor region having the N conductive type and arranged in a third surface portion on the second side of the substrate in the diode cell region, wherein the third semiconductor region provides a cathode region of the diode cell region; a fourth semiconductor region having the P conductive type and arranged in a fourth surface portion on the first side of the substrate, wherein the fourth semiconductor region surrounds the active element cell area, and the fourth semiconductor region is electrically coupled with the first semiconductor region; a fifth semiconductor region having the P conductive type and arranged in a fifth surface portion on the first side of the substrate, wherein the fifth semiconductor region surrounds the fourth semiconductor region; and a sixth semiconductor region having the N conductive type and arranged in a sixth surface portion on the second side of the substrate, wherein the sixth semiconductor region is disposed below the fourth semiconductor region. The second semiconductor region, the third semiconductor region and the sixth semiconductor region are electrically coupled with each other.

In the above device, a recovery current is reduced without increasing a forward operation voltage.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

Figure 1A:
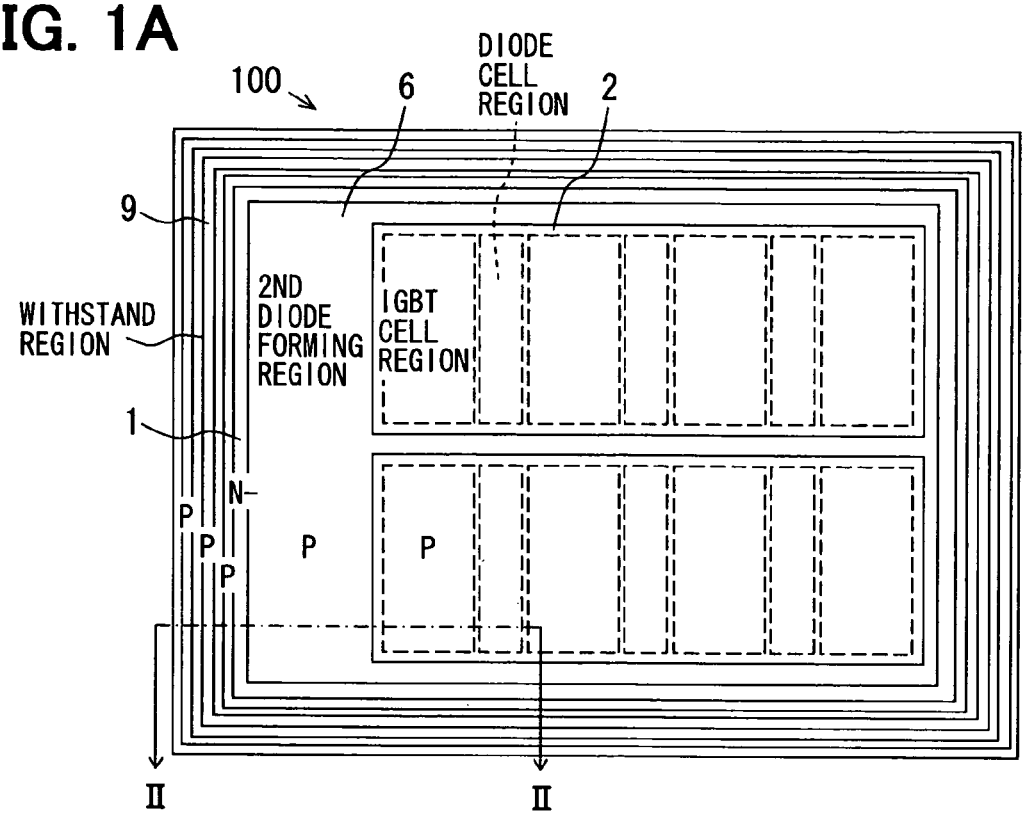
FIG. 1A is a top view showing a semiconductor device according to an example embodiment.
Figure 1B:
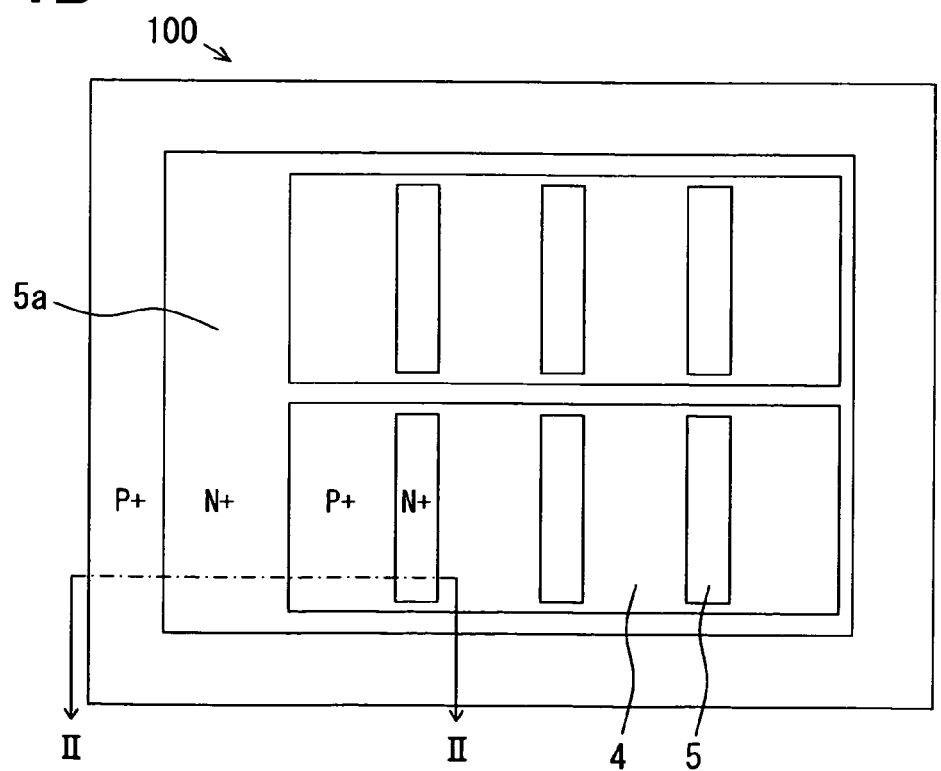
FIG. 1B is a bottom view showing the device.
Figure 2:
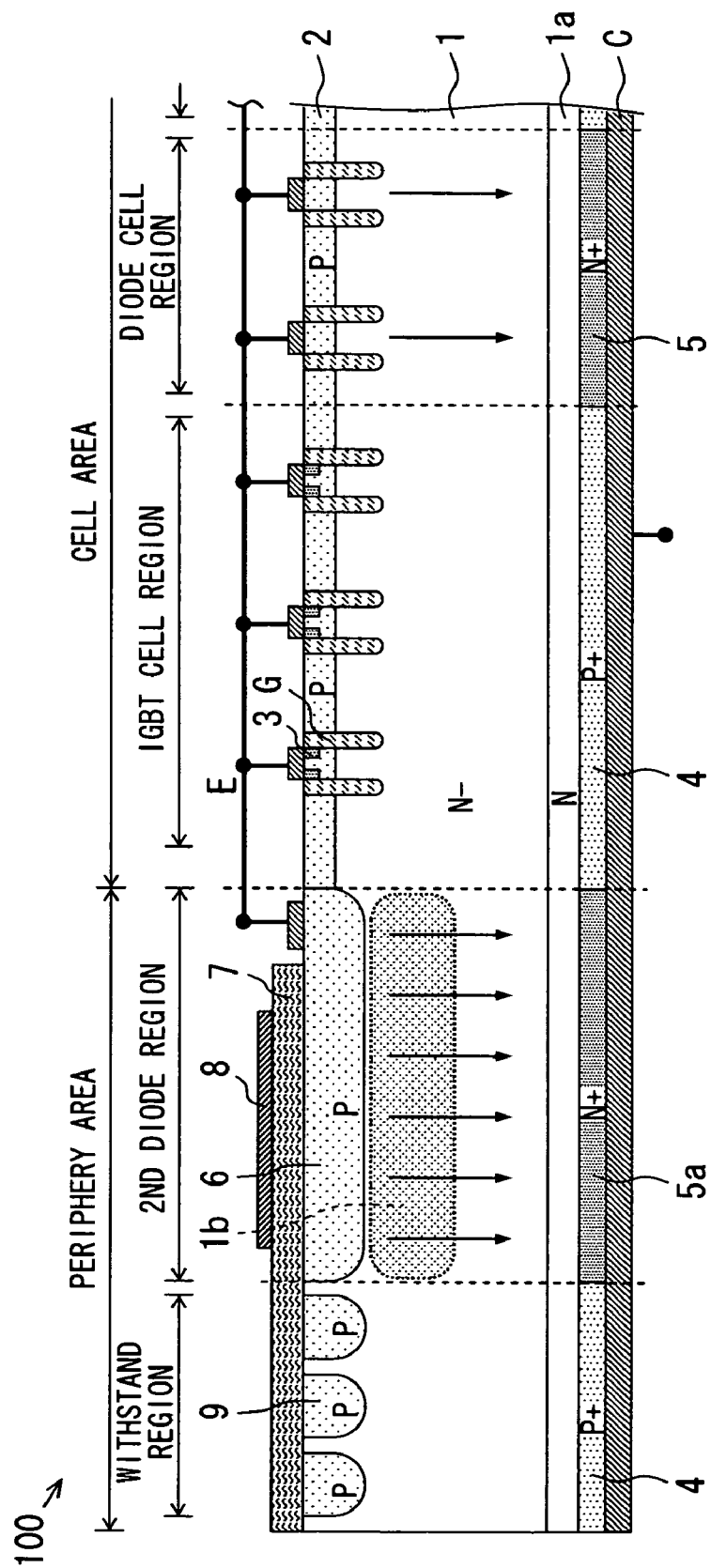
FIG. 2 is a cross sectional view showing the device taken along line II-II in FIGS. 1A and 1B.

FIGS. 1A, 1B and 2 show a semiconductor device 100 according to an example embodiment.

The device 100 may be used for an inverter circuit in a vehicle. The device 100 includes an IGBT cell region and a diode cell region, which are formed on a semiconductor substrate 1 having a N⁻ conductive type. In the device 100, the IGBT cell region and the diode cell region provide an active device area. In the active device area, a first semiconductor region 2 having a P conductive type is formed in a surface portion of the substrate 1 on a principal side i.e., a foreside. The first semiconductor region 2 as a base region provides a channel forming region in the IGBT cell region and an anode region in the diode cell region. An emitter region 3 of the IGBT is formed in the first semiconductor region 2 in the IGBT cell region. A gate electrode G having a trench structure is formed in the IGBT cell region. A similar trench structure is also formed in the diode cell region. The trench structure in the diode cell region is not electrically connected to other parts. Thus, the trench structure in the diode cell region divides the diode cell region into multiple parts. In the IGBT cell region, a second semiconductor region 4 having a P+ conductive type and providing a collector region is formed in a surface portion of the substrate 1 on a backside. In the diode cell region, a third semiconductor region 5 having a N+ conductive type and providing a cathode region is formed on the backside of the substrate 1. The impurity concentration in the third semiconductor region 5 is about $1 \times 10^{19}$ cm$^{-3}$. A field stop layer 1a of the IGBT having a N conductive type is formed on the second and third semiconductor regions 4, 5.

A fourth semiconductor region 6 having the P conductive type is formed in a surface portion of the substrate 1 on the principal side in a second diode region. The fourth semiconductor region 6 surrounds the active device cell region. The first and fourth semiconductor regions 2, 6 are electrically connected to each other together with the emitter region 3 of the IGBT cell region via an emitter electrode wiring E. A pad 8 is formed on the fourth semiconductor region 6 via a LOCOS oxide film 7. The pad 8 provides the pad region. The pad region and the second diode region provide a periphery area. In the periphery area, a fifth semiconductor region 9 having the P conductive type is formed in a surface portion of the substrate 1 on the principal side. The fifth semiconductor region 9 surrounds the fourth semiconductor region 6, and provides a withstand region. The fourth and fifth semiconductor regions 6, 9 are formed at the same time under the same ion implantation condition.

A sixth semiconductor region 5a having the N+ conductive type is formed in a surface portion of the substrate on the backside. The sixth semiconductor region 5a is arranged below the fourth semiconductor region 6. The sixth semiconductor region 5a is formed in the same ion implantation process as the third semiconductor region 5 with using a certain mask pattern. Accordingly, the impurity concentration of the sixth semiconductor region 5a is equal to that of the third semiconductor region 5. Specifically, the impurity concentration of the sixth semiconductor region 5a is about $1 \times 10^{19}$ cm$^{-3}$. The second, third and sixth semiconductor regions 4, 5, 5a on the backside of the substrate 1 is electrically connected to each other with a collector electrode C, which covers the whole surface of the backside of the substrate 1.

In the device 100, the IGBT cell region and the diode cell region are formed on the same substrate 1 having the N conductive type so that an IGBT and a diode are formed in the same substrate 1. Thus, the device 100 has a small size.

The sixth semiconductor region 5a having the N conductive type is formed on the backside of the substrate 1 and disposed below the fourth semiconductor region 6 having the P conductive type on the principal side of the substrate 1. The fourth semiconductor region 6 surrounds the active device cell area. Further, the third semiconductor region 5 having the N conductive type is formed on the backside of the substrate 1 in the diode cell region. The fourth semiconductor region 6 on the principal side of the substrate 1 is electrically and commonly connected to the first semiconductor region 2 having the P conductive type and providing the anode region in the diode cell region. The sixth semiconductor region 5a on the backside of the substrate 1 is electrically and commonly connected to the third semiconductor region 5, which provides the cathode region in the diode cell region. Accordingly, in the device 100, not only the diode cell region in the active device cell region but also the fourth semiconductor region 6 in the periphery area are substantially used as the second diode forming region. In the conventional semiconductor device 80, the fourth semiconductor region 6 is merely used as the pad region in the periphery area. In FIG. 2, the current flowing through the second diode forming region and the current flowing through the diode cell region are shown as arrows when the second diode forming region and the diode cell region function along the forward direction.

Figure 3:
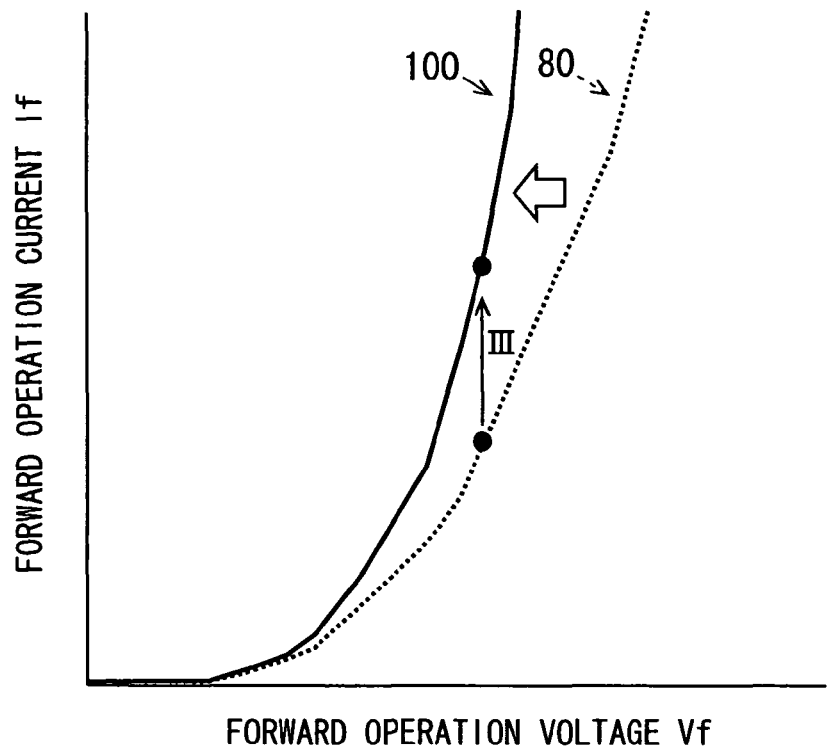
FIG. 3 is a graph showing a relationship between Vf and If when a diode is operated in a forward direction.
Figure 4:
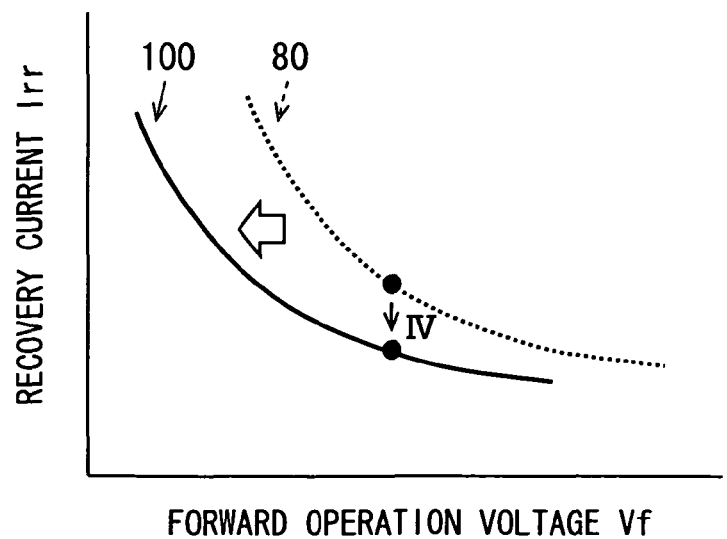
FIG. 4 is a graph showing a relationship between Vf and Irr when the diode is used as a FWD.
Figure 12A:
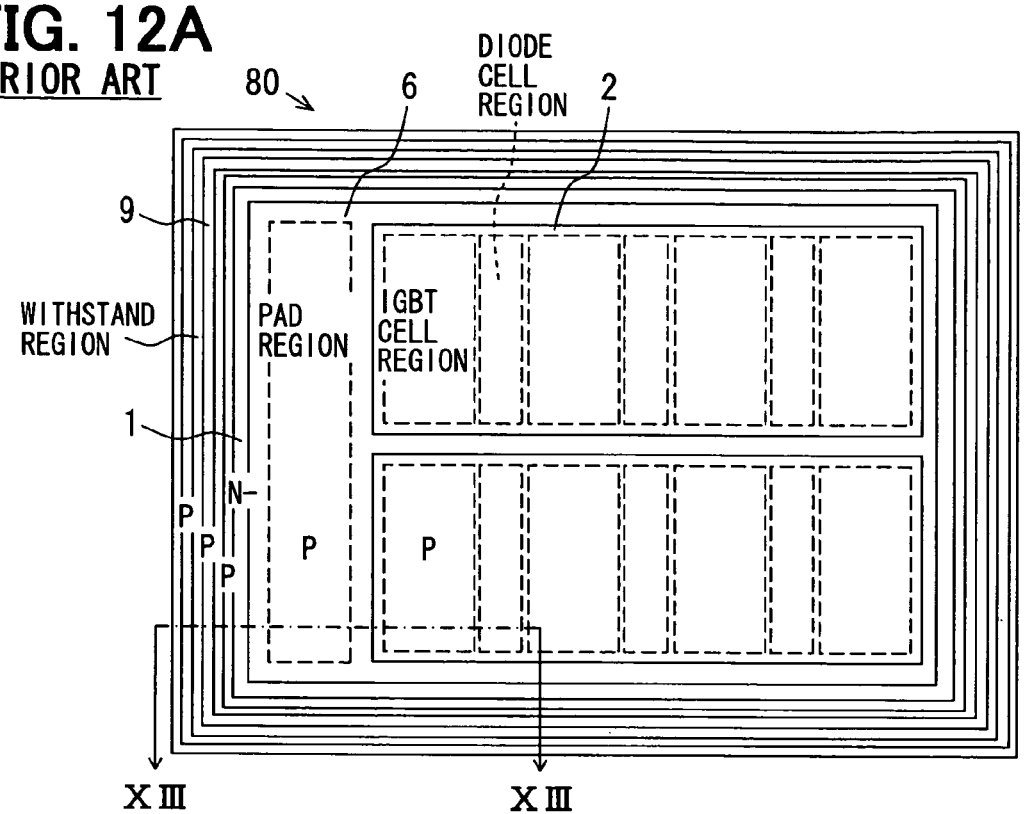
FIG. 12A is a top view showing a semiconductor device according to the prior art.
Figure 12B:
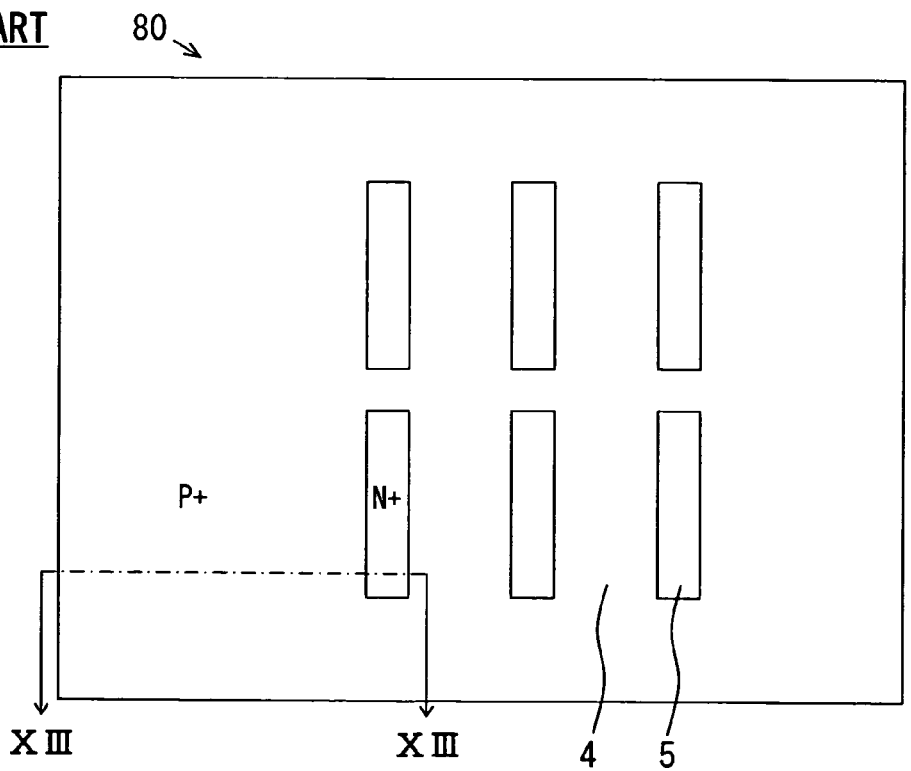
FIG. 12B is a bottom view showing the device.
Figure 13:
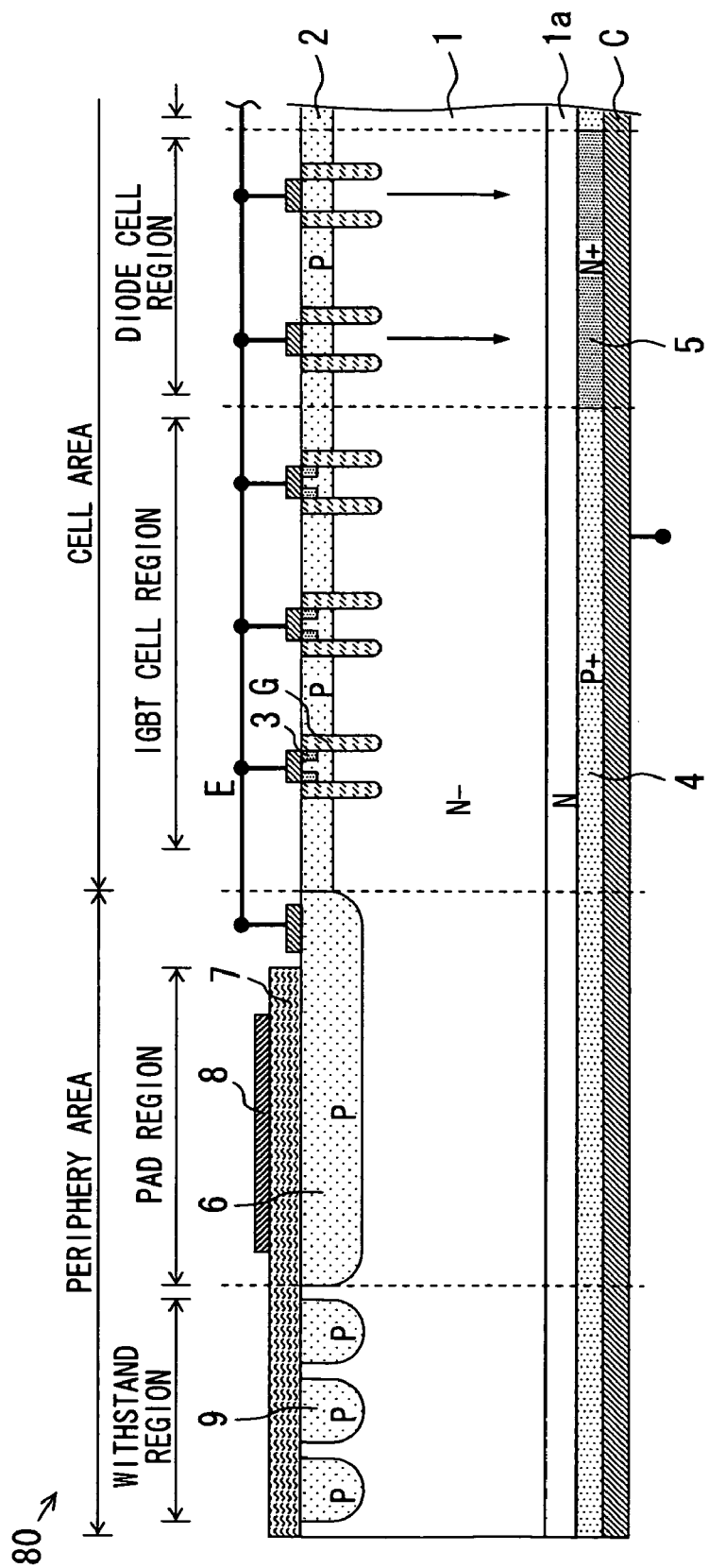
FIG. 13 is a cross sectional view showing the device taken along line XIII-XIII in FIGS. 12A and 12B.
Figure 14:
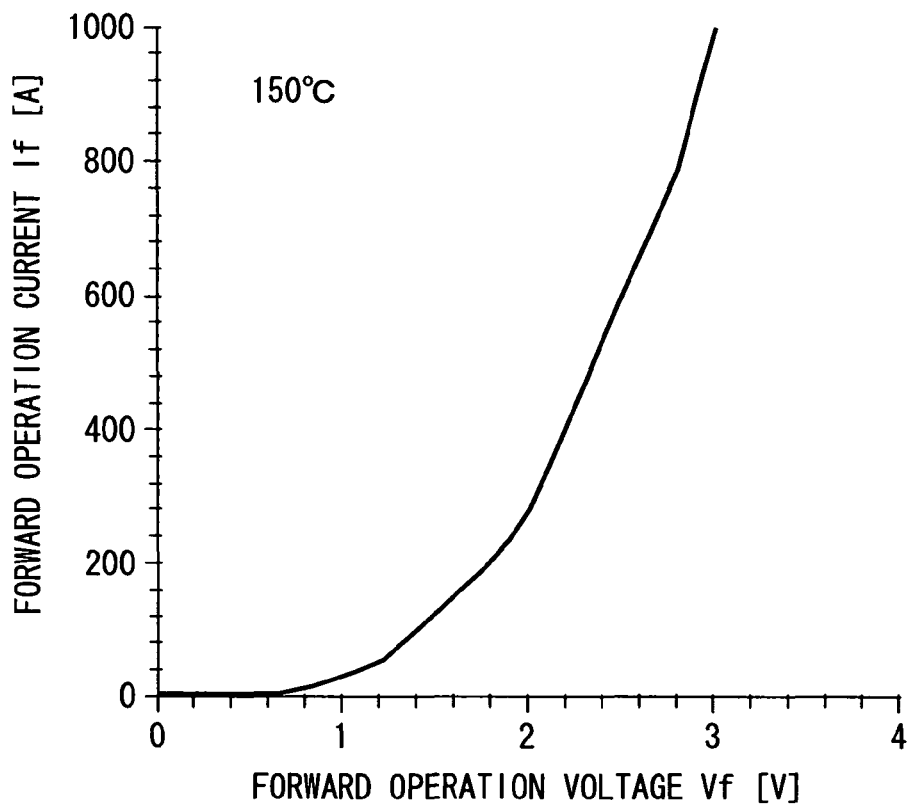
FIG. 14 is a graph showing a relationship between Vf and If when a diode used for the inverter is operated in a forward direction.
Figure 15:
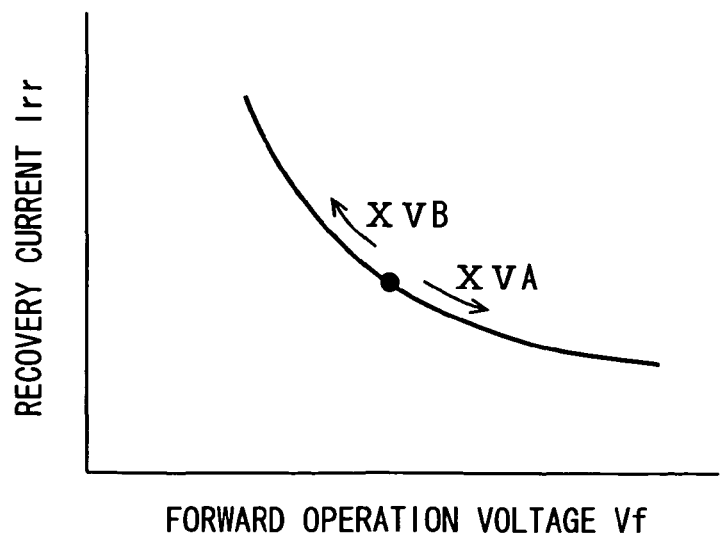
FIG. 15 is a graph showing a relationship between Vf and Irr when the diode is used as a FWD.

FIGS. 3 and 4 show comparison of electric characteristics between the device 100 in FIGS. 1 and 2 and the device 80 in FIGS. 12A, 12B and 13. FIG. 3 shows a voltage-current (i.e., Vf-If) characteristic of a diode in each of the devices 80, 100 when the diode functions along with the forward direction. FIG. 4 shows a relationship between a recovery current Irr and a forward operation voltage Vf when the diode in each of the devices 80, 100 is used for a FWD.

The electric characteristics in the device 100 are changed from those in the device 80 since the diode efficiency is improved, as shown an arrow III in FIG. 3. The diode in the device 100 has the Vf-If characteristics in a case where the diode functions along with the forward direction in such a manner that the forward operation current If is shifted to be larger when the same forward operation voltage Vf is applied to the diode, compared with the device 80. Thus, when the forward operation current If is the same, the forward operation voltage Vf in the device 100 becomes smaller that the device 80. Accordingly, as shown in FIG. 4, when the diode in the device 100 is used for the FWD, the forward operation voltage Vf becomes smaller than that in the device 80 when the recovery current Irr is constant. Thus, as shown an arrow IV in FIG. 4, the recovery current Irr in the device 100 becomes smaller than that of the device 80 when the forward operation voltage Vf is constant.

In the device 100, the IGBT cell region and the diode cell region are formed on the same semiconductor substrate 1, and the device 100 has small dimensions. The device 100 provides to reduce the recovery current Irr without increasing the forward operation voltage Vf.

Figure 5A:
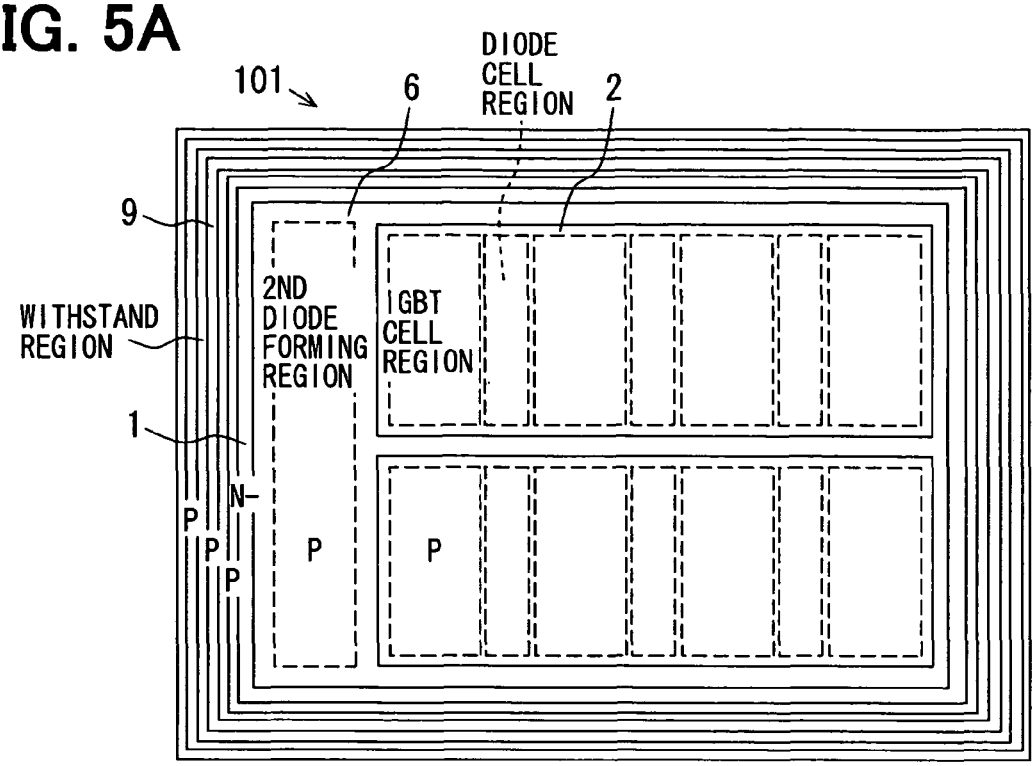
FIG. 5A is a top view showing another semiconductor device according to another example embodiment.
Figure 5B:
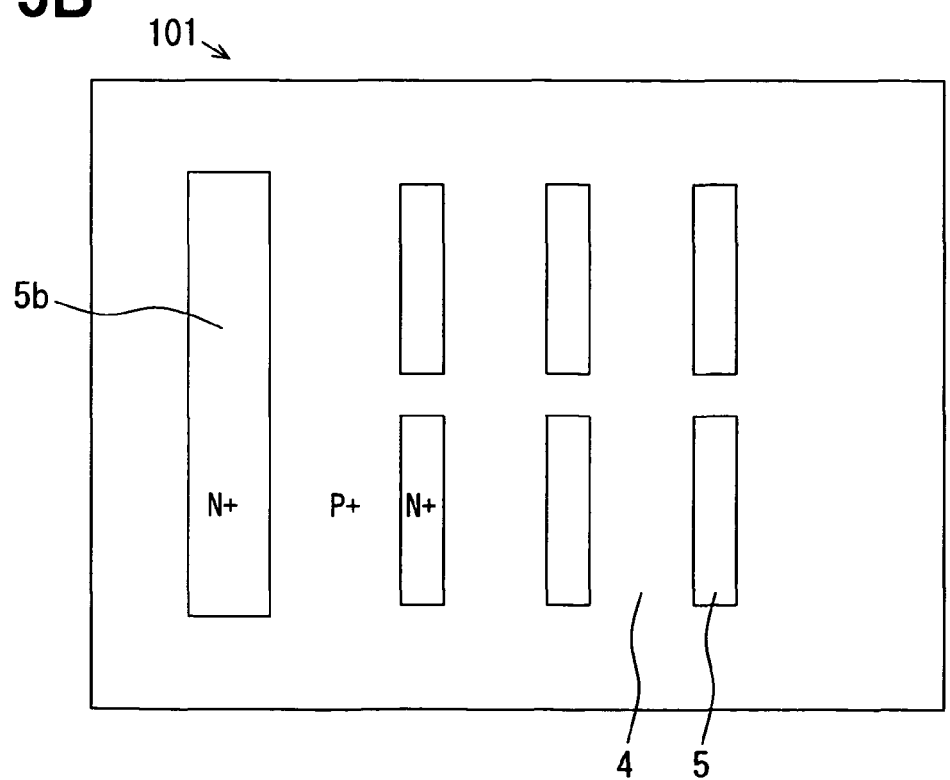
FIG. 5B is a bottom view showing the device.
Figure 6A:
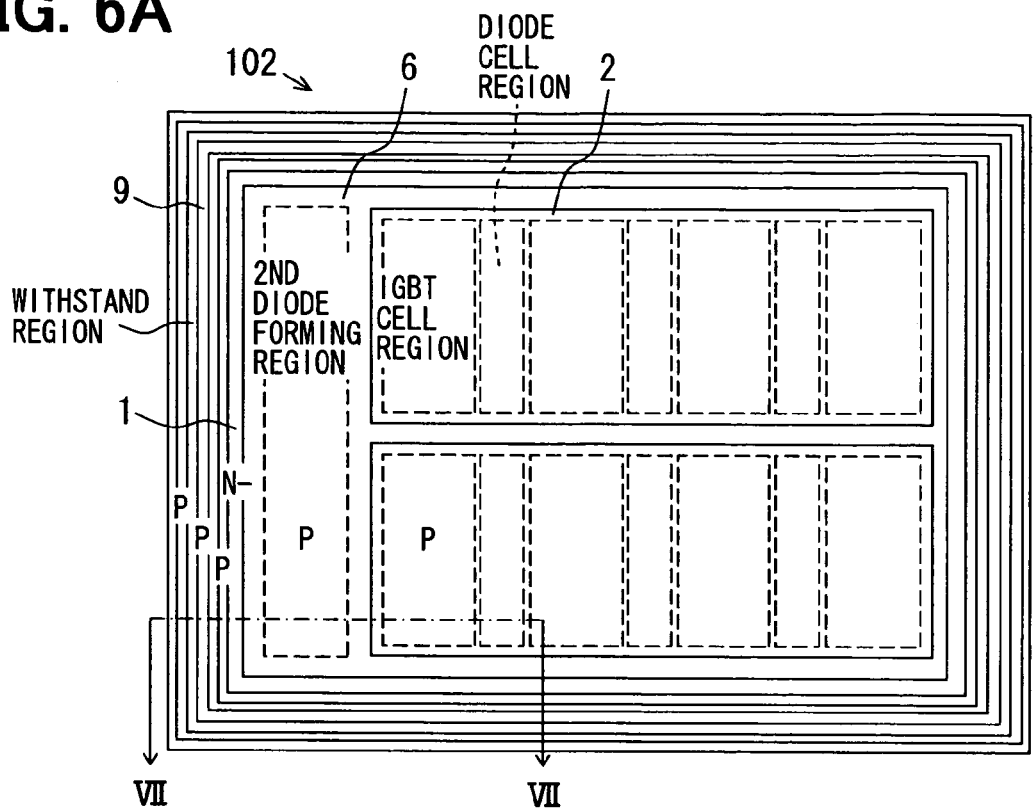
FIG. 6A is a top view showing further another semiconductor device according to further another example embodiment.
Figure 6B:
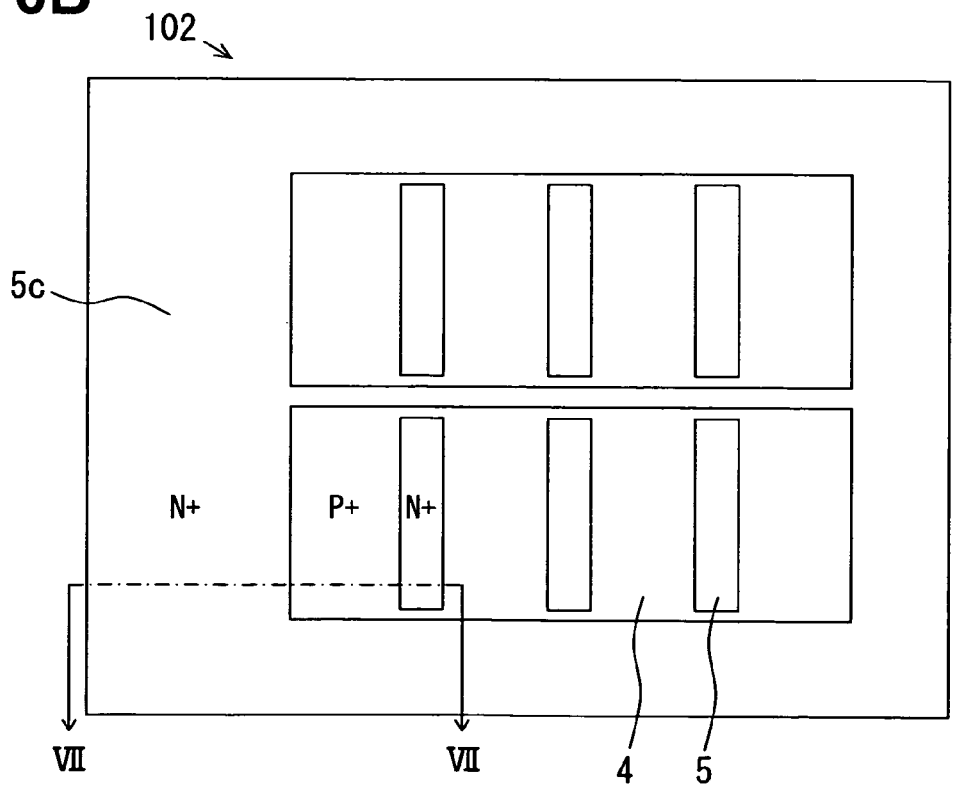
FIG. 6B is a bottom view showing the device.
Figure 7:
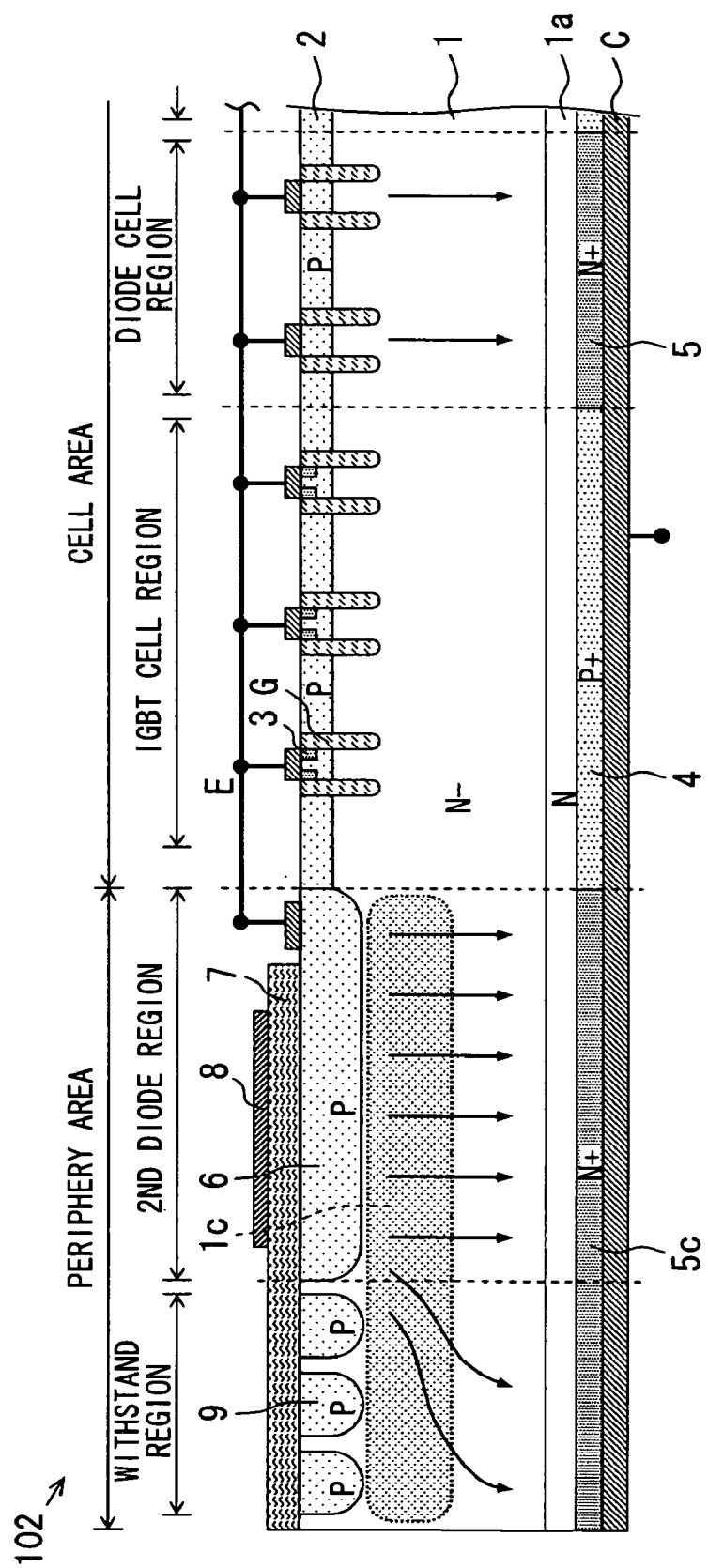
FIG. 7 is a cross sectional view showing the device taken along line VII-VII in FIGS. 6A and 6B.

FIGS. 5A and 5B show another semiconductor device 101, and FIGS. 6A and 6B show another semiconductor device 102. FIG. 7 is a cross sectional view showing the device 102 taken along line VII-VII in FIGS. 6A and 6B.

In the device 100 in FIGS. 1A to 2, the sixth semiconductor region 5a on the backside of the substrate 1 is formed below the fourth semiconductor region 6 on the principal side of the substrate 1. In the device 100, a part of the backside of the substrate 1 fully corresponds to the fourth semiconductor region 6, and the sixth semiconductor region 5a is formed on a whole of the part of the backside of the substrate 1. In the device 101 shown in FIGS. 5A and 5B, the sixth semiconductor region 5b on the backside of the substrate 1 is partially formed below the fourth semiconductor region 6. In the device 102 shown in FIG. 7, the sixth semiconductor region 5c is formed on a whole surface other than the second and third semiconductor regions 4, 5 of the backside of the substrate 1.

The sixth semiconductor region 5b, 5c functions as a cathode region of the second diode forming region. It is sufficient to form the sixth semiconductor region 5b in the device 101 partially below the fourth semiconductor region 6. Preferably, the sixth semiconductor region 5a in the device 100 is fully formed below the fourth semiconductor region 6. Preferably, the sixth semiconductor region 5c in the device 102 is formed on a whole surface other than the second and third semiconductor regions 4, 5 of the backside of the substrate 1. In these cases, the area for the second diode forming region increases, so that the efficiency of the diode is improved. Thus, when the diode is used as the FWD, the recovery current Irr becomes smaller in a case where the forward operation voltage Vf is constant.

Each region 1b, 1c in the devices 100, 102 in FIGS. 2 and 7 is disposed in the substrate 1 under the fourth semiconductor region 6. In the region 1b, 1c, a lifetime of a hole as a carrier is controlled. The region 1b, 1c is defined as a lifetime control region. In the lifetime control region 1b, 1c, the lifetime of the hole in the substrate 1 is set to be shorter than that in a region under the first semiconductor region 2. The lifetime of the hole in the substrate 1 under the fourth semiconductor region 6 can be controlled by, for example, an electron beam irradiation method, a helium irradiation method, a high energy ion implantation method, a gold diffusion method, or a platinum diffusion method.

In the devices 100, 102, when the fourth and fifth semiconductor regions 6, 9 are formed at the same time under the same ion implantation condition, the impurity concentration of the fourth semiconductor region 6 becomes rather high. Therefore, an injection amount of the hole into the substrate 1 is increased. Thus, it is preferred that the lifetime of the hole in the substrate 1 under the fourth semiconductor region 6 is set to be shorter than that under the first semiconductor region 2. Thus, when the device is operated in the inverse direction, the hole as the carrier accumulated in the substrate 1 is rapidly disappeared, so that the increase of the recovery current Irr caused by the arrangement of the fourth semiconductor region 6 having the high impurity concentration is restricted. According to a simulation result, it is preferred that the lifetime of the hole in the substrate 1 under the fourth semiconductor region 6 is in a range between $1 \times 10^{-8}$ seconds and $1 \times 10^{-6}$ seconds.

The characteristics of the IGBT are easily changed in accordance with the lifetime control. Accordingly, in the active element cell area including the diode cell region, the recovery current Irr is reduced by changing a structure such as lowering the impurity concentration of the first semiconductor region 2 without controlling the lifetime of the hole.

Figure 8:
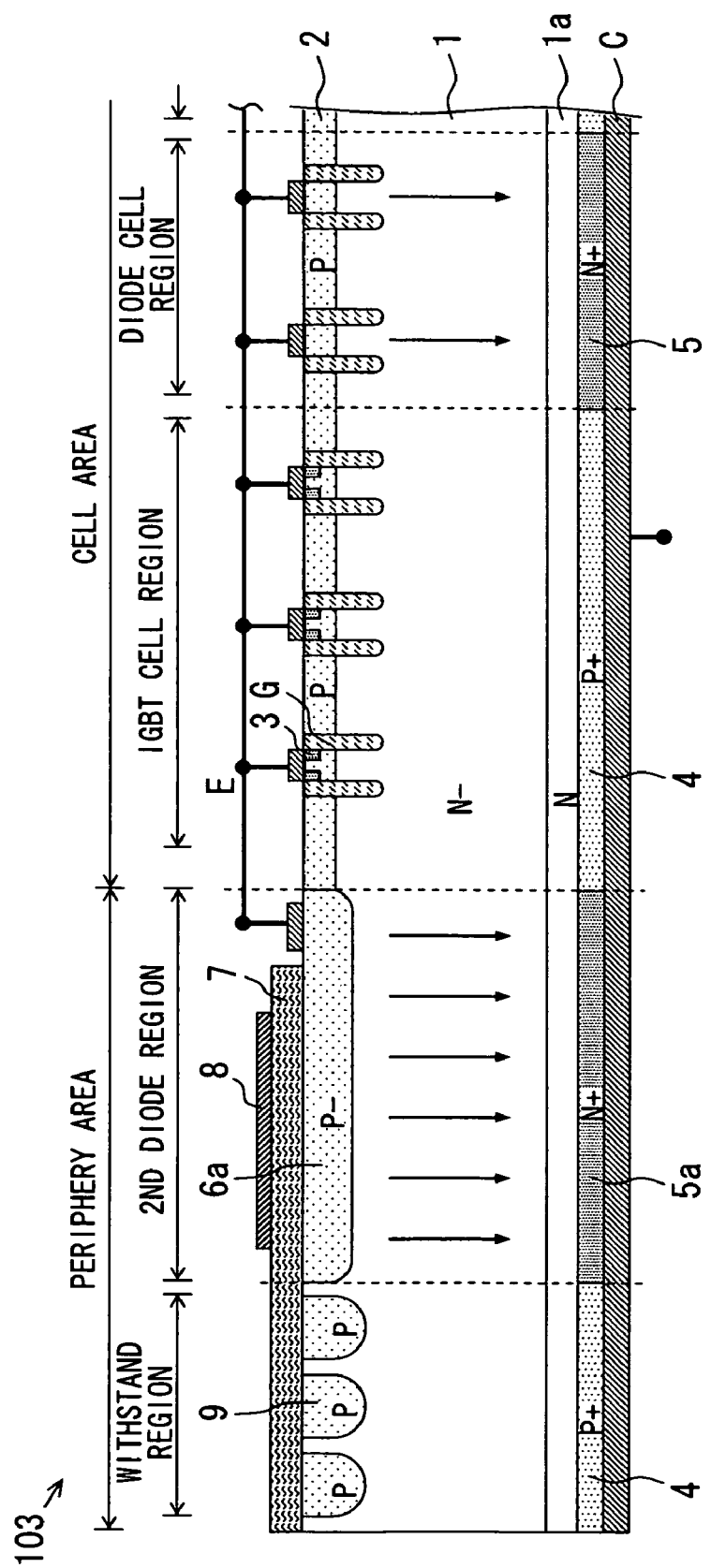
FIG. 8 is a cross sectional view showing another semiconductor device according to another example embodiment.
Figure 9:
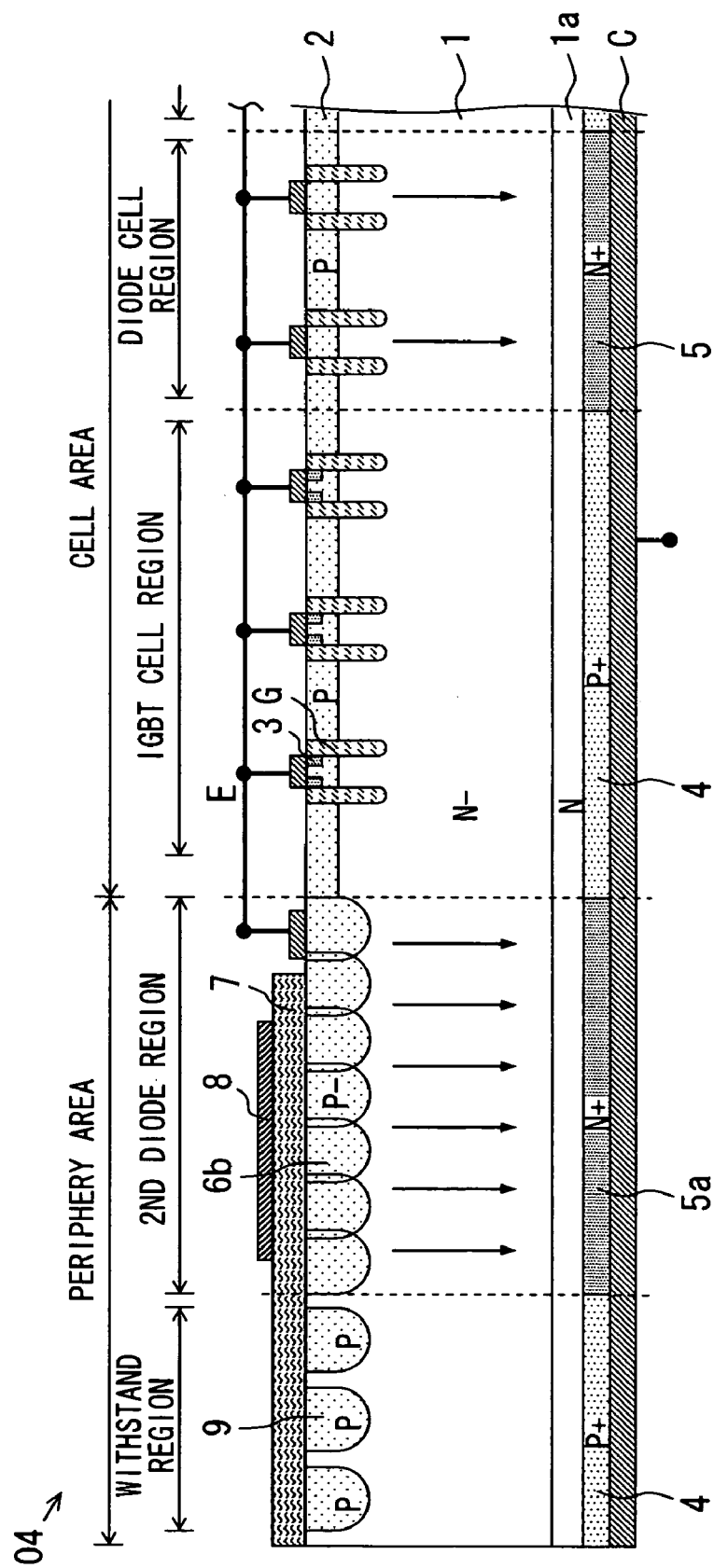
FIG. 9 is a cross sectional view showing further another semiconductor device according to further another example embodiment.
Figure 10:
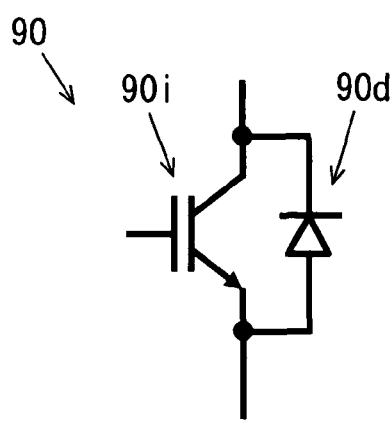
FIG. 10 is a circuit diagram showing an equivalent circuit of a semiconductor device used for an inverter circuit according to a prior art.
Figure 11A:
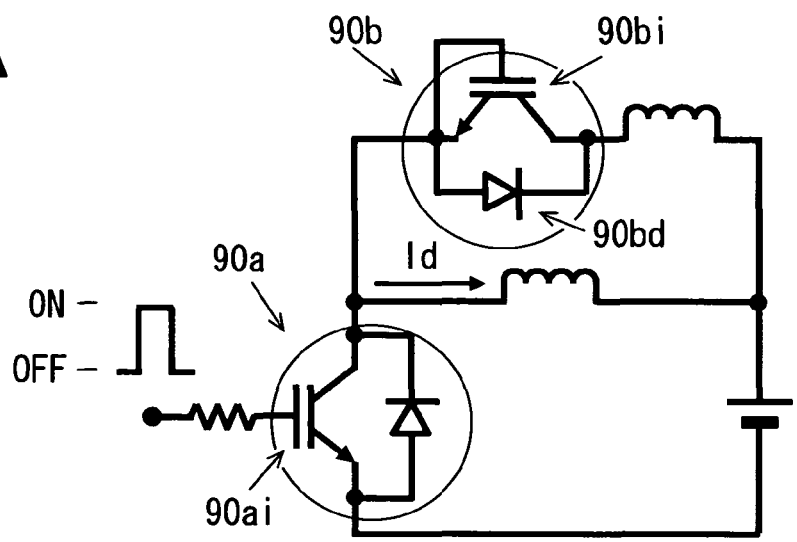
FIG. 11A is a circuit diagram showing an evaluation circuit for evaluating current waveform in a diode of the device shown in FIG. 10.
Figure 11B:
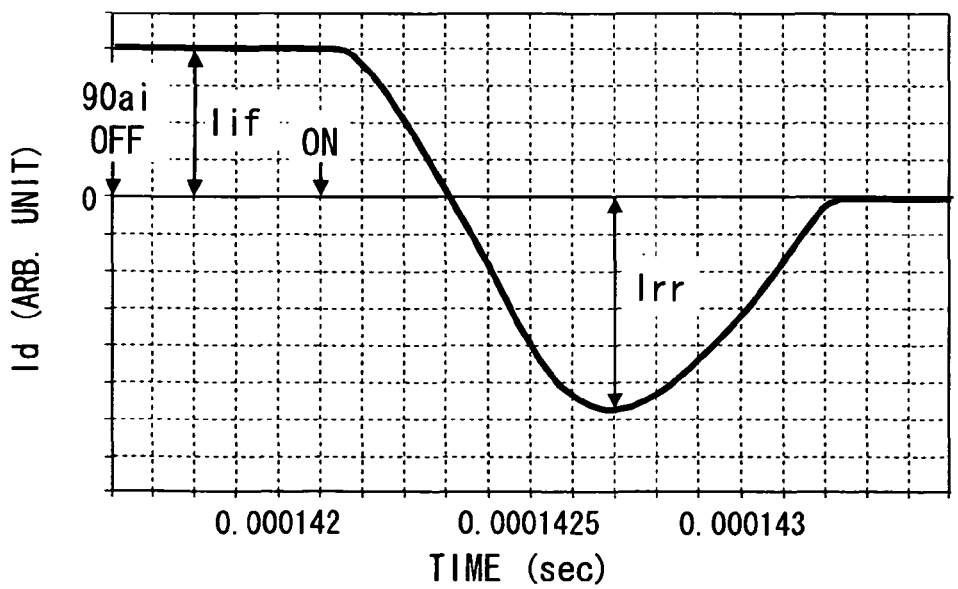
FIG. 11B is a graph showing an example of the current waveform.

FIGS. 8 and 9 show other semiconductor devices 103, 104.

In each device 103, 104, the impurity concentration of the fourth semiconductor region 6a, 6b is lower than the impurity concentration of the fifth semiconductor region 9. The device 103 in FIG. 8, the fourth semiconductor region 6a has a low impurity concentration. The fourth semiconductor region 6a is formed under an ion implantation condition, which is different from that of the fifth semiconductor region 9. In the device 104 in FIG. 9, the opening for forming the fourth semiconductor region 4b is smaller than the opening for forming the fifth semiconductor region 9. The fourth and fifth semiconductor regions 6b, 9 are formed at the same time under the same ion implantation condition, so that the impurity implanted is diffused in a lateral direction of the substrate 1 by a thermal diffusion method. Thus, the fourth semiconductor region 6b having the low impurity concentration. In the device 103 in FIG. 8, the fifth semiconductor region 9 is formed under a condition that a surface impurity concentration is $3 \times 10^{18}$ cm$^{-3}$, and a diffusion depth is 8 μm. The fourth semiconductor region 6a is formed under the condition that the surface impurity concentration is $1 \times 10^{18}$ cm$^{-3}$, and the diffusion depth is in a range between 4 μm and 8 μm. In the device 104 in FIG. 9, the fourth semiconductor region 6b is formed such that multiple ion implanted regions are discretely formed via the opening under the condition equal to that of the fifth semiconductor region 9. Specifically, the condition of the fifth semiconductor region 9 is such that the condition that a surface impurity concentration is $3 \times 10^{18}$ cm$^-$, and the diffusion depth is 8 μm. The plurality of ion implanted regions expand in the lateral direction of the substrate 1 in a lateral diffusion process until they overlap, creating a contiguous region. Thus, the impurity concentration of the fourth semiconductor region 6b is wholly lowered.

In the devices 103, 104, in a region under the fourth semiconductor region 6a, 6b, the density of the hole as the carrier injected into the substrate 1 is reduced, which is similar to a region under the first semiconductor region 2. Thus, the hole accumulated in the substrate 1 is rapidly disappeared when the device functions in the inverse direction. Thus, the increase of the recovery current Irr is reduced when the device is operated in the inverse direction. According to a simulation result, it is preferred that the impurity concentration of the fourth semiconductor region 6a, 6b is equal to or lower than $1 \times 10^{17}$ cm$^{-3}$.

In the devices 101-104, the IGBT cell region and the diode cell region are formed on the same semiconductor substrate 1, and each device 101-104 has small dimensions. The devices 101-104 provide to reduce the recovery current Irr without increasing the forward operation voltage Vf.

Thus, the above devices 101-104 are suitably used for the inverter circuit on a vehicle for driving a load such as a motor, the circuit being required to reduce the recovery current Irr without increasing the forward operation voltage Vf.

Figure 16:
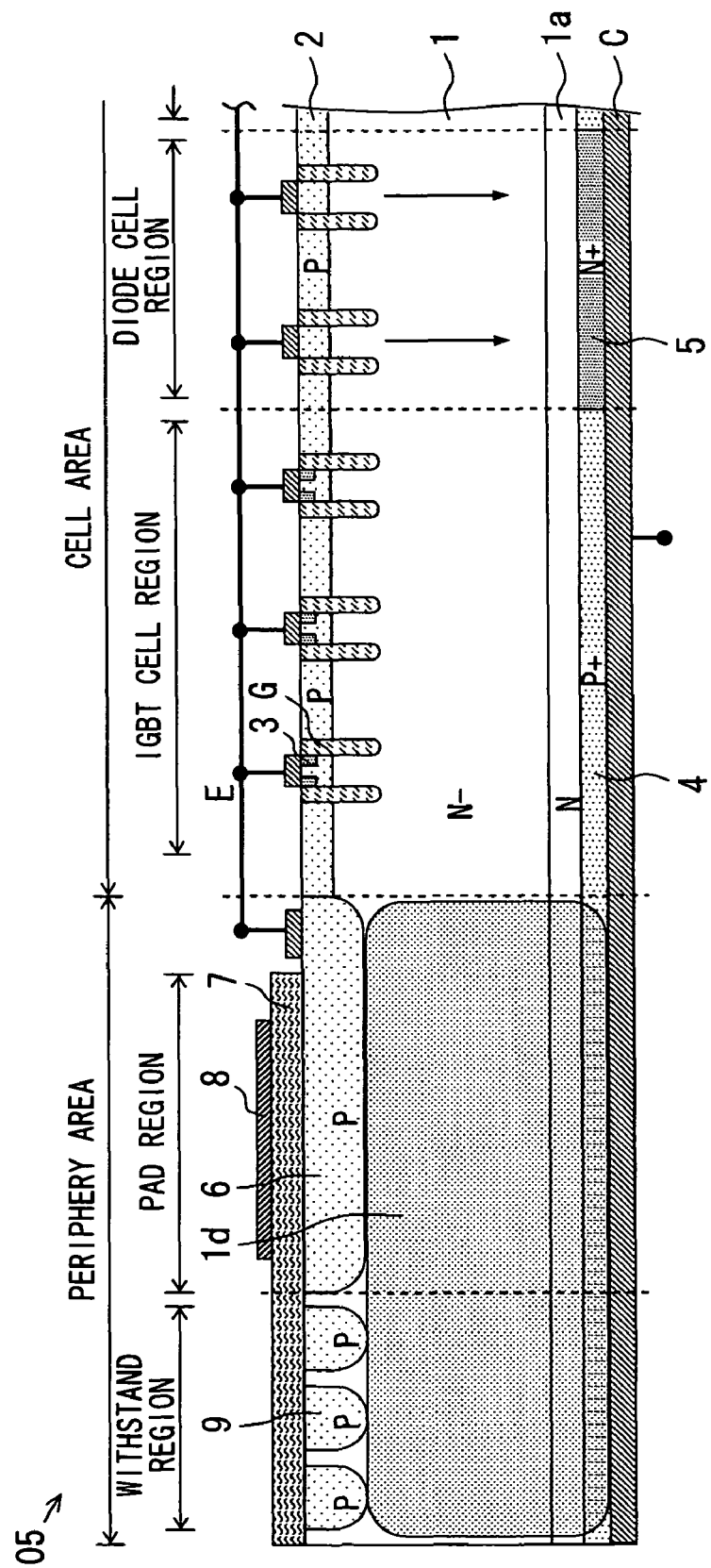
FIG. 16 is a cross sectional view showing another semiconductor device according to another example embodiment.

FIG. 16 shows another semiconductor device 105, in which a lifetime control region Id is only disposed in the periphery area. Specifically, there is no lifetime control region in the active element cell area. In this case, a hole injected from a parasitic diode is reduced, so that recovery characteristics are improved. Thus, the device 105 provides to reduce the recovery current Irr without increasing the forward operation voltage Vf.

Figure 17:
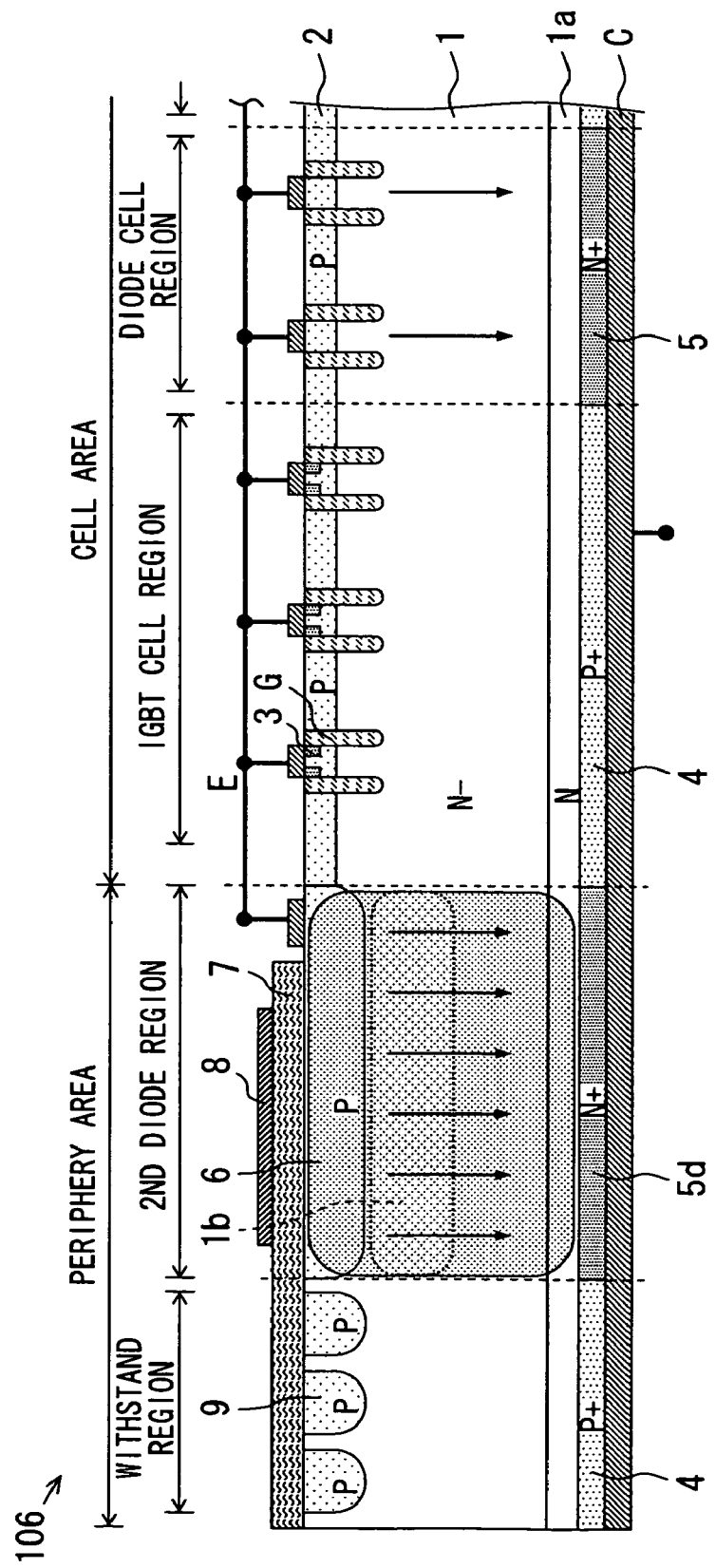
FIG. 17 is a cross sectional view showing another semiconductor device according to another example embodiment.

FIG. 17 shows another semiconductor device 106, in which the sixth semiconductor region 5d has a surface impurity concentration equal to or larger than $1 \times 10^{19}$ cm$^{-3}$. Thus, the sixth semiconductor region 5d disposed in the periphery area has an ohmic contact. Thus, the device 106 provides to reduce the recovery current Irr without increasing the forward operation voltage Vf.

Figure 18:
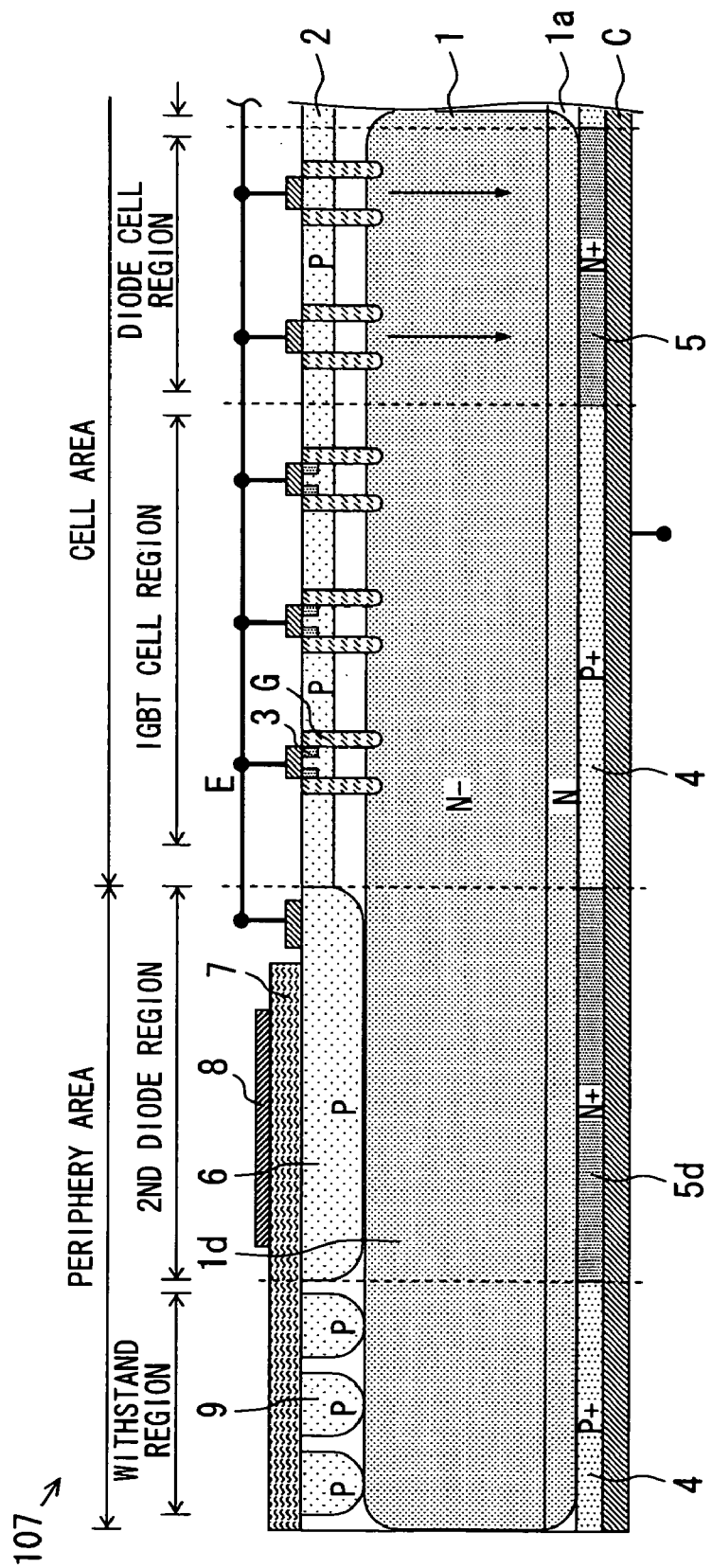
FIG. 18 is a cross sectional view showing another semiconductor device according to another example embodiment.

FIG. 18 shows another semiconductor device 107, in which a lifetime control region Id is disposed in the periphery area and the cell area. Further, the sixth semiconductor region 5d is disposed on a backside of the periphery area. In this case, a hole injected from a parasitic diode is reduced, so that recovery characteristics are improved.

The above disclosure has the following aspects.

According to an aspect of the present disclosure, a semiconductor device includes: a semiconductor substrate having a N conductive type and having a first side and a second side opposite to the first side; an active element cell area including IGBT cell region and a diode cell region and arranged in the substrate; a first semiconductor region having a P conductive type and arranged in a first surface portion on the first side of the substrate in the active element cell area, wherein the first semiconductor region provides both of a channel forming region of the IGBT cell region and an anode region of the diode cell region; a second semiconductor region having the P conductive type and arranged in a second surface portion on the second side of the substrate in the IGBT cell region, wherein the second semiconductor region provides a collector region of the IGBT cell region; a third semiconductor region having the N conductive type and arranged in a third surface portion on the second side of the substrate in the diode cell region, wherein the third semiconductor region provides a cathode region of the diode cell region; a fourth semiconductor region having the P conductive type and arranged in a fourth surface portion on the first side of the substrate, wherein the fourth semiconductor region surrounds the active element cell area, and the fourth semiconductor region is electrically coupled with the first semiconductor region; a fifth semiconductor region having the P conductive type and arranged in a fifth surface portion on the first side of the substrate, wherein the fifth semiconductor region surrounds the fourth semiconductor region; and a sixth semiconductor region having the N conductive type and arranged in a sixth surface portion on the second side of the substrate, wherein the sixth semiconductor region is disposed below the fourth semiconductor region. The second semiconductor region, the third semiconductor region and the sixth semiconductor region are electrically coupled with each other.

In the above device, a recovery current is reduced without increasing a forward operation voltage.

Alternatively, the sixth surface portion may wholly correspond to the fourth semiconductor region. Alternatively, the sixth surface portion may be disposed on a whole of the second side of the substrate other than the second semiconductor region and the third semiconductor region.

Alternatively, the fourth semiconductor region and the fifth semiconductor region may have the same ion implantation condition so that the fourth semiconductor region and the fifth semiconductor region are formed at the same time, and a lifetime of hole in the substrate under the fourth semiconductor region is shorter than that under the first semiconductor region. Further, the lifetime of hole in the substrate under the fourth semiconductor region may be in a range between $1 \times 10^{-6}$ seconds and $1 \times 10^{-8}$ seconds. Further, the lifetime of hole in the substrate under the fourth semiconductor region may be defined by electron beam irradiation, helium irradiation, high energy ion implantation, gold diffusion or platinum diffusion.

Alternatively, an impurity concentration of the fourth semiconductor region may be lower than an impurity concentration of the fifth semiconductor region. Further, a surface impurity concentration of the fourth semiconductor region may be equal to or smaller than $1 \times 10^{17}$ cm$^{-3}$. Further, the fourth semiconductor region and the fifth semiconductor region may have different ion implantation condition. Further, a mask for providing the fourth semiconductor region may include an opening, which is smaller than an opening of another mask for providing the fifth semiconductor region. The fourth semiconductor region and the fifth semiconductor region have the same ion implantation condition so that the fourth semiconductor region and the fifth semiconductor region are formed at the same time, and the fourth semiconductor region is provided in such a manner that an implanted ion is thermally diffused in a direction in parallel to the substrate.

Alternatively, the semiconductor device may be used for an inverter mounted on a vehicle.

Alternatively, the semiconductor device may further include: a gate electrode in a trench arranged on the first side of the substrate in the active element cell area to penetrate the first semiconductor region; an emitter region arranged on the first side of the substrate; and a field stop layer having the N conductive type and arranged between the substrate and the second semiconductor region. The gate electrode, the emitter region, the collector region and the field stop layer provide an IGBT, and the cathode and the anode provide a diode. Further, the fourth semiconductor region and the sixth semiconductor region may provide a second diode region. The fifth semiconductor region provides a withstand region, and the second diode region and the withstand region provide a periphery area. Furthermore, the semiconductor device may further include: a hole lifetime control region arranged in the substrate under the fourth semiconductor region. The hole lifetime control region has a hole lifetime in a range between $1 \times 10^{-8}$ seconds and $1 \times 10^{-6}$ seconds, and the second semiconductor region, the third semiconductor region and the sixth semiconductor region are electrically coupled with each other.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:
1. A semiconductor device comprising:
a semiconductor substrate having a N conductive type and having a first side and a second side opposite to the first side;
an active element cell area including an IGBT cell region and a diode cell region and arranged in the semiconductor substrate;
a first semiconductor region having a P conductive type and arranged in a first surface portion on the first side of the semiconductor substrate in the active element cell area, wherein the first semiconductor region provides both of a channel forming region of the IGBT cell region and an anode region of the diode cell region;
a second semiconductor region having the P conductive type and arranged in a second surface portion on the second side of the semiconductor substrate in the IGBT cell region, wherein the second semiconductor region provides a collector region of the IGBT cell region;
a third semiconductor region having the N conductive type and arranged in a third surface portion on the second side of the semiconductor substrate in the diode cell region, wherein the third semiconductor region provides a cathode region of the diode cell region;
a fourth semiconductor region having the P conductive type and arranged in a fourth surface portion on the first side of the semiconductor substrate, wherein the fourth semiconductor region surrounds the active element cell area, and the fourth semiconductor region is electrically coupled with the first semiconductor region;
a fifth semiconductor region having the P conductive type and arranged in a fifth surface portion on the first side of the semiconductor substrate, wherein the fifth semiconductor region surrounds the fourth semiconductor region;
a sixth semiconductor region having the N conductive type and arranged in a sixth surface portion on the second side of the semiconductor substrate, wherein the sixth semiconductor region is disposed below the fourth semiconductor region, and
a pad for coupling with a bonding wire disposed on the fourth semiconductor region via an insulation film,
wherein the sixth semiconductor region is formed around an entire outer circumference of the active element cell area,
wherein the second semiconductor region, the third semiconductor region and the sixth semiconductor region are electrically coupled with each other, wherein a whole of the sixth semiconductor region is formed opposite a whole of the fourth semiconductor region.

2. The semiconductor device according to claim 1, wherein the sixth surface portion wholly corresponds to the fourth semiconductor region.

3. The semiconductor device according to claim 1, wherein the sixth surface portion is disposed on a whole of the second side of the semiconductor substrate other than the second semiconductor region and the third semiconductor region.

4. The semiconductor device according to claim 1, wherein the fourth semiconductor region and the fifth semiconductor region have the same ion implantation condition so that the fourth semiconductor region and the fifth semiconductor region are formed at the same time, and
wherein a lifetime of a hole in the semiconductor substrate under the fourth semiconductor region is shorter than that under the first semiconductor region.

5. The semiconductor device according to claim 4, wherein the lifetime of a hole in the semiconductor substrate under the fourth semiconductor region is in a range between $1\times10^{-6}$ seconds and $1\times10^{-8}$ seconds.

6. The semiconductor device according to claim 4, wherein the lifetime of a hole in the semiconductor substrate under the fourth semiconductor region is defined by electron beam irradiation, helium irradiation, high energy ion implantation, gold diffusion or platinum diffusion.

7. The semiconductor device according to claim 1, wherein an impurity concentration of the fourth semiconductor region is lower than an impurity concentration of the fifth semiconductor region.

8. The semiconductor device according to claim 7, wherein a surface impurity concentration of the fourth semiconductor region is equal to or smaller than $1\times10^{17}$ cm$^{-3}$.

9. The semiconductor device according to claim 7, wherein the fourth semiconductor region and the fifth semiconductor region have different ion implantation condition.

10. The semiconductor device according to claim 7, wherein the fourth semiconductor region and the fifth semiconductor region have the same ion implantation condition so that the fourth semiconductor region and the fifth semiconductor region are formed at the same time,
wherein the fourth semiconductor region is provided in such a manner that an implanted ion is thermally diffused in a direction in parallel to the substrate to form a plurality of fourth implanted ion areas,
wherein the fifth semiconductor region is provided in such a manner that the implanted ion is thermally diffused in a direction in parallel to the substrate to form a plurality of fifth implanted ion areas, and
wherein the plurality of implanted ion areas overlap, such that the fourth semiconductor region is contiguous, and the plurality of fifth implanted ion areas do not overlap, such that the fifth semiconductor region is discretely arranged.

11. The semiconductor device according to claim 1, wherein the semiconductor device is used for an inverter mounted on a vehicle.

12. The semiconductor device according to claim 1, further comprising:
a gate electrode in a trench arranged on the first side of the semiconductor substrate in the active element cell area to penetrate the first semiconductor region;
an emitter region arranged on the first side of the semiconductor substrate; and
a field stop layer having the N conductive type and arranged between the semiconductor substrate and the second semiconductor region,
wherein the gate electrode, the emitter region, the collector region and the field stop layer provide an IGBT, and
wherein the cathode and the anode provide a diode.

13. The semiconductor device according to claim 12, wherein the fourth semiconductor region and the sixth semiconductor region provide a second diode region,
wherein the fifth semiconductor region provides a withstand region, and
wherein the second diode region and the withstand region provide a periphery area.

14. The semiconductor device according to claim 13, further comprising:
a hole lifetime control region arranged in the semiconductor substrate under the fourth semiconductor region,
wherein the hole lifetime control region has a hole lifetime in a range between $1\times10^{-8}$ seconds and $1\times10^{-6}$ seconds, and
wherein the second semiconductor region, the third semiconductor region and the sixth semiconductor region are electrically coupled with each other.

* * * * *